United States Patent
Kawakami et al.

(10) Patent No.: US 6,942,833 B2
(45) Date of Patent: Sep. 13, 2005

(54) CERAMIC MULTILAYER SUBSTRATE MANUFACTURING METHOD AND UNFIRED COMPOSITE MULTILAYER BODY

(75) Inventors: Hiromichi Kawakami, Moriyama (JP); Yoshifumi Saito, Otsu (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 10/476,155
(22) PCT Filed: Jan. 24, 2003
(86) PCT No.: PCT/JP03/00641
§ 371 (c)(1), (2), (4) Date: Jun. 28, 2004
(87) PCT Pub. No.: WO03/072325
PCT Pub. Date: Sep. 4, 2003

(65) Prior Publication Data
US 2005/0008824 A1 Jan. 13, 2005

(30) Foreign Application Priority Data
Feb. 26, 2002 (JP) .............................. 2002-050234

(51) Int. Cl.$^7$ .......................... B32B 31/00; B32B 29/00; H01L 23/12
(52) U.S. Cl. ................... 264/672; 264/642; 264/297.4; 156/85; 156/89.11; 428/210
(58) Field of Search ............................ 428/210; 156/85, 156/89.11; 264/642, 672, 297.4

(56) References Cited

U.S. PATENT DOCUMENTS

| | | | | |
|---|---|---|---|---|
| 5,102,720 A | * | 4/1992 | Raj | 428/209 |
| 5,254,191 A | * | 10/1993 | Mikeska et al. | 156/89.15 |
| 5,708,570 A | * | 1/1998 | Polinski, Sr. | 361/762 |
| 5,855,711 A | * | 1/1999 | Araki et al. | 156/89.16 |
| 6,139,666 A | * | 10/2000 | Fasano et al. | 156/85 |
| 6,205,032 B1 | * | 3/2001 | Shepherd | 361/793 |
| 6,228,196 B1 | * | 5/2001 | Sakamoto et al. | 156/89.17 |

FOREIGN PATENT DOCUMENTS

| | | |
|---|---|---|
| EP | 0 535 711 A2 | 4/1993 |
| EP | 0 479 219 B1 | 1/1995 |
| EP | 1 178 714 A2 | 2/2002 |
| JP | 60-169126 | 2/1985 |
| JP | 03-084993 | 4/1991 |

(Continued)

OTHER PUBLICATIONS

International Search Report—PCT/JP03/00641.

*Primary Examiner*—Cathy F. Lam
(74) *Attorney, Agent, or Firm*—Dickstein, Shapiro, Morin & Oshinsky, LLP.

(57) ABSTRACT

To produce a green composite laminate 11, a green multilayer collective substrate 13 containing low-temperature sinterable glass ceramic powder as a main ingredient is disposed between first and second shrinkage-restraining layers 14a and 14b containing alumina powder as a main ingredient. Grooves 16 are formed on one main surface 11a of the green composite laminate 11 such as to pass through the first shrinkage-restraining layer 14a and the green multilayer collective substrate 13 and reach the second shrinkage-restraining layer 14b, but not to reach the other main surface 11b of the green composite laminate 11. The green composite laminate 11 provided with the grooves 16 is sintered under conditions where the low-temperature sinterable glass ceramic powder is sintered and the green first and second shrinkage-restraining layers 14a and 14b are removed to prepare a plurality of ceramic multilayer substrates. This manufacturing method offers ceramic multilayer substrates with a high dimensional accuracy and substantially prevents defective divisions when a multilayer collective substrate is split into a plurality of ceramic multilayer substrates.

20 Claims, 3 Drawing Sheets

FOREIGN PATENT DOCUMENTS

| | | |
|---|---|---|
| JP | 04-243978 | 9/1992 |
| JP | 05-028867 | 2/1993 |
| JP | 05-102666 | 4/1993 |
| JP | 06-270122 | 9/1994 |
| JP | 06-283861 | 10/1994 |
| JP | 07-099263 | 4/1995 |
| JP | 2002-043757 | 2/2002 |
| WO | WO 03/072325 A1 | 4/2003 |

* cited by examiner

CERAMIC MULTILAYER SUBSTRATE MANUFACTURING METHOD AND UNFIRED COMPOSITE MULTILAYER BODY

TECHNICAL FIELD

The present invention relates to a method for manufacturing ceramic multilayer substrates that can be used for mounting chip components such as semiconductor devices and monolithic ceramic capacitors, and to a green composite laminate produced at a step in this method. In particular, the present invention relates to a method for manufacturing ceramic multilayer substrates by splitting a large-area multilayer collective substrate into a plurality of ceramic multilayer substrates.

BACKGROUND ART

In recent years, the performance of electronic components in the electronics field has been greatly enhanced, contributing to high-speed information processing, compact design, and multifunctional design of information processing apparatuses such as mainframes, mobile communicating terminals, and personal computers. A multichip module (MCM), having multiple semiconductor devices such as VLSIs and ULSIs on its ceramic substrate, is one of these electronic components. In such a module, a ceramic multilayer substrate having wiring conductors arranged three-dimensionally is often used in order to increase the packaging density of LSIs and achieve good electric connections between LSIs.

A ceramic multilayer substrate is produced by firing a green multilayer collective substrate formed of a plurality of laminated ceramic green sheets. Unfortunately, green multilayer collective substrates, when fired by a conventional technique, shrink in the directions along the main surfaces and across the thickness, resulting in dimensional errors of about 0.4% to 0.6% particularly in the directions along the main surfaces. This may cause outer conductors to suffer from a degraded positional accuracy and inner conductors to be deformed, distorted, or broken.

In view of the problems described above, Japanese Unexamined Patent Application Publication No. 4-243978 discloses a method for manufacturing ceramic multilayer substrates, which is described below.

First, glass ceramic powder that is sinterable at temperatures of 1000° C. or less and alumina powder that is not sintered at the sintering temperature of this glass ceramic powder are prepared. Then, ceramic green sheets containing the glass ceramic powder are laminated on one another, and the resultant green multilayer substrate is then interposed between shrinkage-restraining layers containing the alumina powder. Thus, a green composite laminate is produced.

The composite laminate is then fired under the sintering conditions used for the glass ceramic powder. At this time, the alumina powder contained in the shrinkage-restraining layers is not substantially sintered, and therefore shrinkage does not substantially occur in the shrinkage-restraining layers. The above-mentioned effect causes the shrinkage-restraining layers to restrain the green multilayer substrate, so that the multilayer substrate shrinks across the thickness only; shrinkage in the directions along the main surfaces is suppressed. Removing the shrinkage-restraining layers thereafter by appropriate means allows the ceramic multilayer substrate to be prepared.

The ceramic multilayer substrate obtained by the non-shrinking process described above is highly reliable because it has high dimensional accuracy in the directions along the main surfaces, i.e., the lengthwise direction (X direction) and widthwise direction (Y direction) of the ceramic green sheets, and suffers from less camber and torsion.

In order to efficiently produce such a ceramic multilayer substrate as described above, a multilayer collective substrate including a plurality of ceramic multilayer substrates is first produced and is then split along predetermined split lines into a plurality of ceramic multilayer substrates.

In splitting the multilayer collective substrate as described above, grooves may be formed along respective predetermined split lines on a main surface of the multilayer collective substrate to facilitate the splitting of the multilayer collective substrate.

These grooves are normally formed on a main surface of the green multilayer collective substrate using a cutter or a die. When the ceramic multilayer substrate is produced using shrinkage-restraining layers, as described above, grooves are formed as shown in FIG. 3, which is disclosed in Japanese Unexamined Patent Application Publication No. 7-99263.

FIG. 3 is a sectional view showing a part of a green composite laminate 101 which includes a green multilayer collective substrate 102, a first shrinkage-restraining layer 103, and a second shrinkage-restraining layer 104, the green multilayer collective substrate 102 being interposed between the layers 103 and 104. In FIG. 3, wiring conductors provided on the multilayer collective substrate 102 are not shown and the dimension across the thickness is enlarged.

In FIG. 3, the green multilayer collective substrate 102 includes a plurality of ceramic green sheets 107 containing glass ceramic powder. The first shrinkage-restraining layer 103 and the second shrinkage-restraining layer 104 are formed of a predetermined number of laminated green sheets 108 containing sintering-resistant powder such as alumina powder which is not sintered at the sintering temperature used for the above-mentioned glass ceramic powder.

This green composite laminate 101 is manufactured as follows.

First, the ceramic green sheets containing glass ceramic powder are laminated and compressed in the lamination direction, and thereby the green multilayer collective substrate 102 containing a plurality of the ceramic green sheets 107 is produced. Next, grooves 106 are formed on one main surface of the green multilayer collective substrate 102.

Then, the green sheets 108 containing alumina powder are laminated so as to interpose the green multilayer collective substrate 102, thus the first shrinkage-restraining layer 103 and the second shrinkage-restraining layer 104 are formed. As a result, the green composite laminate 101 is obtained. Subsequently, the green composite laminate 101 is compressed again in the lamination direction, and is then fired at the sintering temperature used for the glass ceramic powder contained in the ceramic green sheets 107.

Then, the first shrinkage-restraining layer 103 and the second shrinkage-restraining layer 104, which are not substantially sintered in the firing step, are removed to produce the sintered multilayer collective substrate 102 with the grooves 106. The sintered multilayer collective substrate 102 is split along the grooves 106 to prepare individual ceramic multilayer substrates.

Before the grooves 106 are formed, as described above, on the green multilayer collective substrate 102, a plurality of the laminated ceramic green sheets need to be precompressed sufficiently in order to prevent the individual ceramic green sheets 107 from shifting at the time the grooves are formed.

However, when the green composite laminate 101 is compressed again, it is difficult to achieve a sufficiently tight bond between the compressed green multilayer collective substrate 102 and the uncompressed first shrinkage-restraining layer 103 and the second shrinkage-restraining layer 104. As a result, the force by which the first shrinkage-restraining layer 103 and the second shrinkage-restraining layer 104 restrain the ceramic green sheets 107 becomes small, possibly failing to satisfactorily prevent shrinkage of the ceramic green sheets 107 during firing, i.e., shrinkage of the green multilayer collective substrate 102 in the surface directions.

Another disadvantage is a low productivity arising from an unusual step of forming the grooves 106 intervening the step of laminating the ceramic green sheets 107 constituting the multilayer collective substrate and the green sheets 108 constituting the shrinkage-restraining layers.

In view of the problems described above, an object of the present invention is to provide a method for manufacturing ceramic multilayer substrates with a high dimensional accuracy and a high reliability in a highly productive manner and to provide a green composite laminate obtained at a step in this method.

DISCLOSURE OF INVENTION

The present invention relates to a method for manufacturing ceramic multilayer substrates, comprising the steps of:

(1) manufacturing a green composite laminate including first and second shrinkage-restraining layers disposed respectively on the upper and lower main surfaces of a green multilayer collective substrate formed of a plurality of laminated ceramic green layers containing ceramic powder as a main ingredient, the first and second shrinkage-restraining layers containing sintering-resistant powder as a main ingredient that is not substantially sintered at the sintering temperature used for the ceramic powder;

(2) forming grooves on the green composite laminate such that the grooves extend from the start of the first shrinkage-restraining layer to the second shrinkage-restraining layer through the first shrinkage-restraining layer and the green multilayer collective substrate;

(3) sintering the multilayer collective substrate disposed between the first and second shrinkage-restraining layers by firing the green composite laminate provided with the grooves under a condition where the ceramic powder is sintered and the sintering-resistant powder is not substantially sintered;

(4) removing the first and second shrinkage-restraining layers which are not substantially sintered from the sintered multilayer collective substrate; and (5) preparing a plurality of ceramic multilayer substrates split along the grooves from the sintered multilayer collective substrate.

In the method for manufacturing the ceramic multilayer substrates according to the present invention, the grooves are preferably arranged in the longitudinal direction and the lateral direction perpendicular to the longitudinal direction.

In the method for manufacturing the ceramic multilayer substrates according to the present invention, the ceramic green layers preferably further contain at least one of glass powder and crystallized glass powder.

In the method for manufacturing the ceramic multilayer substrates according to the present invention, a step of compressing the green composite laminate in the lamination direction is preferably provided after the green composite laminate is produced and before the grooves are provided.

According to the method for manufacturing the ceramic multilayer substrates of the present invention, in the above-described non-shrinking process, the grooves extend from the start of the first shrinkage-restraining layer to the second shrinkage-restraining layer through the first shrinkage-restraining layer and the green multilayer collective substrate. Therefore, a ceramic multilayer substrate with a high dimensional accuracy and a high reliability can be manufactured in a highly productive manner; in particular, a superior handling is achieved during work, preventing defective divisions from occurring after firing.

The ceramic multilayer substrate according to the present invention is not only a mount board for mounting chip components such as semiconductor devices and monolithic ceramic capacitors, but also a ceramic multilayer structure itself, i.e., a laminated ceramic electronic component such as a monolithic ceramic capacitor and a laminated LC filter.

The present invention also provides a green composite laminate including a green multilayer collective substrate formed of a plurality of laminated ceramic green layers containing ceramic powder as a main ingredient; first and second shrinkage-restraining layers which are provided on the upper and lower main surfaces of the green multilayer collective substrate and which include sintering-resistant powder as a main ingredient, wherein the sintering-resistant powder is not sintered at the sintering temperature used for the ceramic powder; and the grooves extending from the start of the first shrinkage-restraining layer to the second shrinkage-restraining layer through the first shrinkage-restraining layer and the green multilayer collective substrate.

According to the green composite laminate of the present invention, the above-mentioned method for manufacturing the ceramic multilayer substrates according to the present invention can be carried out with good reproducibility using the green composite laminate.

BEST MODE FOR CARRYING OUT THE INVENTION

A method for manufacturing ceramic multilayer substrates according to the present invention and embodiments of a green composite laminate will now be described.

Figure 1:
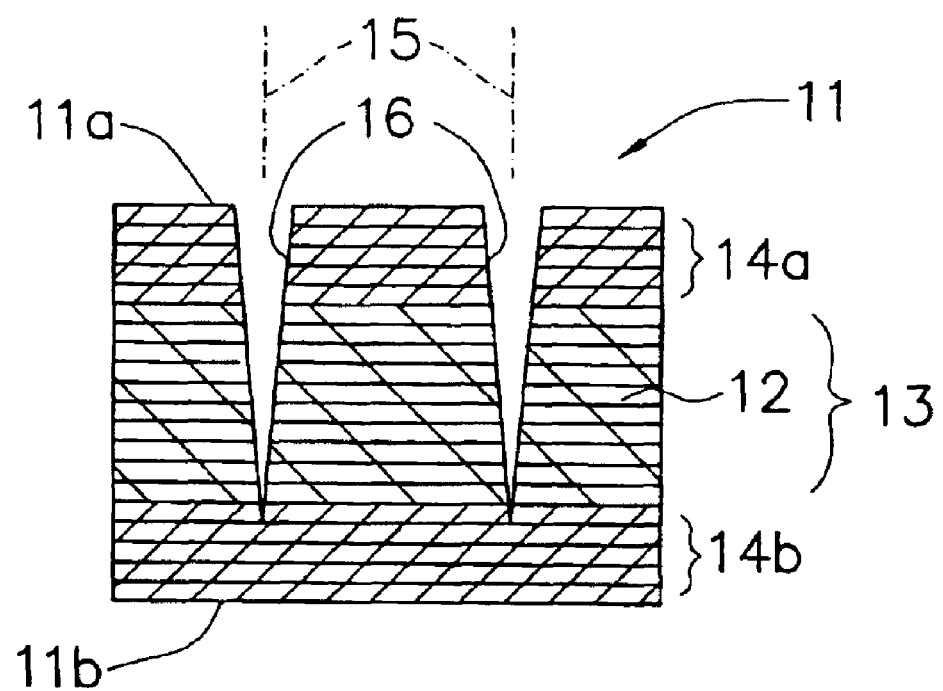
FIG. 1 illustrates an embodiment according to the present invention, and shows a sectional view of a part of a large-area composite laminate obtained at a step in manufacturing a ceramic multilayer substrate.

FIG. 1 illustrates a preferred embodiment of the present invention, showing a large-area green composite laminate 11 obtained at a step in manufacturing a ceramic multilayer substrate.

FIG. 1 is a sectional view showing a part of the green composite laminate 11 with the dimension across the thickness enlarged. Wiring conductors are not shown in the figure.

The green composite laminate 11 includes a large-area green multilayer collective substrate 13 formed of a plurality of laminated ceramic green layers 12 whose main ingredient is a powdered ceramic insulating material as ceramic powder and shrinkage-restraining layers 14a and 14b formed respectively on the upper and lower main surfaces of the substrate 13, the layers 14a and 14b containing sintering-resistant inorganic powder that is not sintered at the sintering temperature used for the powdered ceramic insulating material. Furthermore, grooves 16 are provided on one main surface (upper main surface) 11a of the green composite laminate 11 along predetermined split lines 15. The grooves 16 extend from the start of the first shrinkage-restraining layer 14a to the interior of the second shrinkage-restraining layer 14b through the first shrinkage-restraining layer 14a and the green multilayer collective substrate 13.

The method for manufacturing the ceramic multilayer substrates according to the present invention will now be described with reference to FIGS. 1 and 2.

First, glass powder composed of a mixture of, for example, $SiO_2$, $CaO$, $Al_2O_3$, and $B_2O_3$ is mixed with alumina powder as ceramic powder at an equal ratio by weight (50:50), an organic binder and toluene as a solvent are added to the resultant low-temperature sinterable glass ceramic powder, which is then mixed with a ball mill and defoamed under a reduced pressure to produce a slurry.

As the ceramic powder, standard materials used for ceramic multilayer substrates, such as powdered ceramic dielectric materials and powdered ceramic magnetic materials, can be used, as well as powdered ceramic insulating materials such as low-temperature sinterable glass ceramic powder. In particular, glass powder or crystallized glass powder contained in the mixture allows sintering at relatively lower temperatures, i.e., temperatures lower than the melting points of copper and silver, thereby allowing sintering-resistant inorganic powder contained in the first and second shrinkage-restraining layers 14a and 14b to be selected from a wider range of choices. For organic vehicles such as the organic binder, the solvent, and a plasticizer, standard materials can also be used. No special organic vehicles are required.

The slurry is then formed into a sheet on a carrier film by casting using a doctor blade to produce a ceramic green sheet with a thickness of 0.1 mm. The ceramic green sheet is then dried and peeled off the carrier film. The sheet is then punched out to a predetermined size: a surface area of 100 $mm^2$, for example. The sintering temperature of the low-temperature sinterable glass ceramic powder contained in this ceramic green sheet is preferably 780° C. to 980° C., for example, and more specifically 850° C. Furthermore, a step of applying conductive pastes such as Ag, Ag—Pt, and Ag—Pd, which are finally formed into wiring conductors, by processing such as screen printing, and of providing through-holes to be filled with the conductive pastes is performed as required in the ceramic green sheet.

Some of the ceramic green sheets obtained as described above (ten of them for example) are laminated to produce the green multilayer collective substrate 13 having the ceramic green layers 12.

Next, an organic binder and toluene as a solvent are added to inorganic powder such as alumina powder as sintering-resistant powder, which is then mixed with a ball mill and defoamed under a reduced pressure to produce a slurry.

The sintering-resistant inorganic powder to be used must not be sintered at the sintering temperature of the low-temperature sinterable glass ceramic powder contained in the ceramic green sheets for the ceramic green layers 12. Furthermore, for organic vehicles such as the organic binder, the solvent, and a plasticizer, standard materials can be used. No special organic vehicles are required.

From the obtained slurry, green sheets for the shrinkage-restraining layers are manufactured in the same manner as for the ceramic green sheets in the above-described ceramic green layers 12. The sintering temperature of the inorganic powder contained in these green sheets is preferably 1300° C. or higher, and more specifically 1600° C.

On each of the upper and lower main surfaces of the green multilayer collective substrate 13, five green sheets for a shrinkage-restraining layer are laminated and press-formed in the lamination direction to produce the green composite laminate 11, with a large area of 100 $mm^2$, having the first shrinkage-restraining layer 14a and the second shrinkage-restraining layer 14b.

Subsequently, the grooves 16 are formed using a cutter or a die along the split lines 15 for preparing a plurality of ceramic multilayer substrates so as to extend from the main surface 11a of the green composite laminate 11 to the interior of the second shrinkage-restraining layer 14b through the first shrinkage-restraining layer 14a and the green multilayer collective substrate 13.

Figure 2:
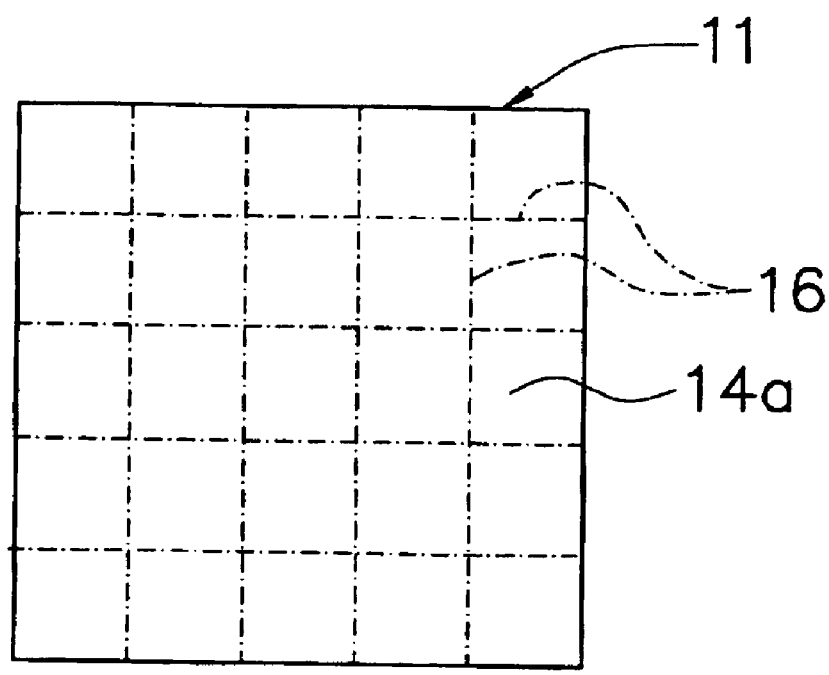
FIG. 2 is a plan view of an array of split lines in the large-area composite laminate shown in FIG. 1.
Figure 3:
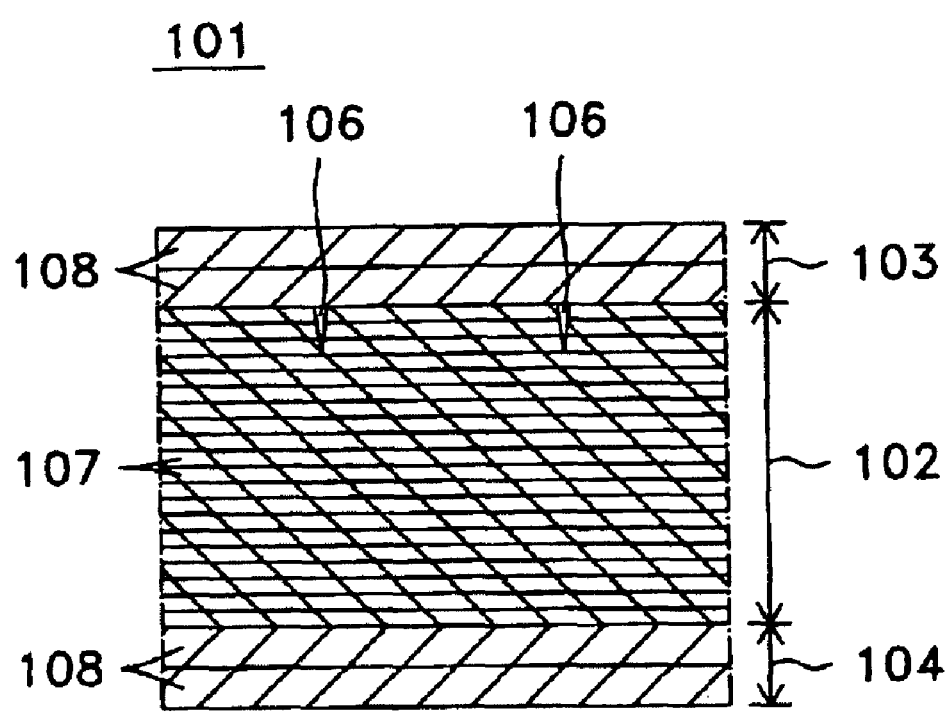
FIG. 3 illustrates a known composite laminate, and shows a sectional view of a part of the large-area composite laminate obtained at a step in manufacturing a ceramic multilayer substrate.

As shown in FIG. 2, the grooves 16 intersect each other orthogonally so as to form a grid-like shape along the split lines 15. If the composite laminate 11 is shaped like a strip, the grooves 16 are provided only in the direction perpendicular to the lengthwise direction.

The grooves 16 pass through the first shrinkage-restraining layer 14a and the green multilayer collective substrate 13 and reach the other shrinkage-restraining layer 14b, but do not reach the other main surface 11b of the green composite laminate 11. Preferably, the grooves 16 are formed so as to penetrate the first shrinkage-restraining layer 14a and the green multilayer collective substrate 13 and reach a point about $1/10$ to $4/10$ into the thickness of the second shrinkage-restraining layer 14b.

The green composite laminate 11 provided with the grooves 16 is disposed in a furnace and then fired under conditions where the powdered ceramic insulating material in the multilayer collective substrate 13 is sintered but the inorganic powder in each shrinkage-restraining layer is not substantially sintered. In more detail, the temperature is increased at the following rates: 1.5° C./min up to 400° C., and then 5° C./min to 60° C./min between 400° C. and 900° C., for example. Thereafter, firing for 5 to 60 minutes with the temperature maintained at 900° C. allows only the multilayer collective substrate 13 of the composite laminate 11 to be sintered.

Subsequently, the substantially unsintered shrinkage-restraining layers 14a and 14b, which are respectively disposed at the upper and lower portions, are removed from the sintered multilayer collective substrate 13 using a tool such as a brush, thus preparing the sintered multilayer collective substrate 13.

This sintered multilayer collective substrate 13 has a large area and is provided with the grooves 16 that pass therethrough, and hence, after being fired, can be easily split into a plurality of ceramic multilayer substrates along the split lines defined by the grooves 16.

According to the above-described method for manufacturing the ceramic multilayer substrates, the grooves extend from one main surface of the large-area green composite laminate having the green multilayer collective substrate interposed between the first and second shrinkage-restraining layers, pass through the first shrinkage-restraining layer and the green multilayer collective substrate, and reach the other shrinkage-restraining layer (but do not reach the other main surface of the composite laminate). Thus, the composite laminate can be handled as a collective substrate, and is therefore superior in handling during work. After being fired, the multilayer collective substrate can easily be split into divisions, substantially preventing defective divisions from occurring during splitting.

In the above-described method for manufacturing the ceramic multilayer substrates, if the green composite laminate 11 having the grooves 16 that pass through the first shrinkage-restraining layer 14a and reach a depth of, for example, 40% of the thickness of the multilayer collective substrate 13 is fired, breaking is not satisfactory at the time of splitting after firing, possibly causing about 10% defective divisions.

INDUSTRIAL APPLICABILITY

As described above, according to the method for manufacturing the ceramic multilayer substrates of the present invention, the ceramic multilayer substrate used for mounting chip components such as monolithic ceramic capacitors and semiconductor devices can exhibit a high productivity while still maintaining a high dimensional accuracy and reliability.

What is claimed is:

1. A method for manufacturing a ceramic multilayer substrate, comprising:

providing a green composite laminate comprising a green multilayer collective substrate comprising a laminate of a plurality of ceramic green layers containing ceramic powder as a main ingredient and having upper and lower main surfaces, and first and second shrinkage-restraining layers disposed respectively on the upper and lower main surfaces, the first and second shrinkage-restraining layers containing sintering-resistant powder that is not substantially sintered at a sintering temperature of the ceramic powder as a main ingredient;

forming at least one groove extending through the first shrinkage-restraining layer and the green multilayer collective substrate and into but not completely through the second shrinkage-restraining layer; and sintering the green composite laminate with the groove under conditions where the ceramic powder is sintered and the sintering-resistant powder is not substantially sintered.

2. The method for manufacturing a ceramic multilayer substrate according to claim 1, wherein the ceramic green layers contain at least one of glass powder and crystallized glass powder.

3. The method for manufacturing a ceramic multilayer substrate according to claim 2, further comprising compressing the green composite laminate in the lamination direction before providing the groove.

4. The method for manufacturing a ceramic multilayer substrate according to claim 3, wherein the groove extends into about $\frac{1}{10}$ to $\frac{4}{10}$ of the thickness of the second shrinkage-restraining layer.

5. The method for manufacturing a ceramic multilayer substrate according to claim 4, wherein a plurality of said grooves are formed.

6. The method for manufacturing a ceramic multilayer substrate according to claim 5, wherein at least one groove is arranged in a longitudinal direction and at least one other groove is arranged in a lateral direction substantially perpendicular to the longitudinal direction.

7. The method for manufacturing a ceramic multilayer substrate according to claim 6, further comprising preparing a plurality of ceramic multilayer substrates by splitting the sintered laminate along the grooves of the sintered multilayer collective substrate.

8. The method for manufacturing a ceramic multilayer substrate according to claim 1, further comprising compressing the green composite laminate in the lamination direction before providing the groove.

9. The method for manufacturing a ceramic multilayer substrate according to claim 1, wherein the groove extends into about $\frac{1}{10}$ to $\frac{4}{10}$ of the thickness of the second shrinkage-restraining layer.

10. The method for manufacturing a ceramic multilayer substrate according to claim 9, wherein at least one groove is arranged in a longitudinal direction and at least one other groove is arranged in a lateral direction substantially perpendicular to the longitudinal direction.

11. The method for manufacturing a ceramic multilayer substrate according to claim 1, wherein a plurality of grooves are formed.

12. The method for manufacturing a ceramic multilayer substrate according to claim 1, further comprising forming at least two ceramic multilayer substrates by splitting the sintered multilayer collective substrate along a groove.

13. The method for manufacturing a ceramic multilayer substrate according to claim 1, further comprising manufacturing the green composite laminate.

14. The method for manufacturing a ceramic multilayer substrate according to claim 1, further comprising removing the substantially unsintered first and second shrinkage-restraining layers from the sintered multilayer collective substrate.

15. The method for manufacturing a ceramic multilayer substrate according to claim 14, wherein the ceramic green layers contain at least one of glass powder and crystallized glass powder, and the green composite laminate is compressed in the lamination direction before providing the groove, and wherein the groove is formed to extend into about $\frac{1}{10}$ to $\frac{4}{10}$ of the thickness of the second shrinkage-restraining layer.

16. The method for manufacturing a ceramic multilayer substrate according to claim 15, wherein a plurality of grooves are formed and the sintered multilayer collective substrate is split along the grooves into a plurality of ceramic multilayer substrate.

17. The method for manufacturing a ceramic multilayer substrate according to claim 16, wherein at least one groove is arranged in a longitudinal direction and at least one other groove is arranged in a lateral direction substantially perpendicular to the longitudinal direction.

18. A green composite laminate comprising:

a green multilayer collective substrate having upper and lower main surfaces and comprising a laminate of a plurality of ceramic green layers containing ceramic powder as a main ingredient;

first and second shrinkage-restraining layers disposed respectively on the upper and lower main surfaces of the green multilayer collective substrate, the first and second shrinkage-restraining layers containing sintering-resistant powder as a main ingredient, the sintering-resistant powder being not substantially sintered at the sintering temperature of the ceramic powder; and at least one groove extending through the first shrinkage-restraining layer and the green multilayer collective substrate and into but not through the second shrinkage-restraining layer.

19. The green composite laminate according to claim 18, wherein the groove extends into about $\frac{1}{10}$ to $\frac{4}{10}$ of the thickness of the second shrinkage-restraining layer.

20. The green laminate according to claim 19, having a plurality of said grooves.

* * * * *